US012230469B2

(12) United States Patent
Mangnus et al.

(10) Patent No.: US 12,230,469 B2
(45) Date of Patent: Feb. 18, 2025

(54) APPARATUS FOR AND METHOD OF LOCAL CONTROL OF A CHARGED PARTICLE BEAM

(71) Applicant: ASML NETHERLANDS B.V., Veldhoven (NL)

(72) Inventors: Albertus Victor Gerardus Mangnus, Eindhoven (NL); Maikel Robert Goosen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 380 days.

(21) Appl. No.: 17/566,518

(22) Filed: Dec. 30, 2021

(65) Prior Publication Data
US 2022/0199355 A1    Jun. 23, 2022

Related U.S. Application Data

(63) Continuation of application No. PCT/EP2020/065759, filed on Jun. 8, 2020.

(30) Foreign Application Priority Data

Jul. 2, 2019   (EP) .................................... 19183767

(51) Int. Cl.
*H01J 37/153*   (2006.01)
*H01J 37/28*    (2006.01)

(52) U.S. Cl.
CPC ............ *H01J 37/153* (2013.01); *H01J 37/28* (2013.01); *H01J 2237/0453* (2013.01); *H01J 2237/1534* (2013.01)

(58) Field of Classification Search
CPC .. H01J 37/00; H01J 37/02; H01J 37/26; H01J 37/28; H01J 37/153; H01J 37/22;
(Continued)

(56) References Cited

U.S. PATENT DOCUMENTS 7,420,164 B2    9/2008 Nakasuji et al.
2008/0296509 A1*  12/2008 Schroder ............... H01J 37/295
                                                   250/398

(Continued)

FOREIGN PATENT DOCUMENTS

CN    101510492 A   8/2009
CN    104285272 A   1/2015

(Continued)

OTHER PUBLICATIONS

International Search Report issued by the International Searching Authority issued in related International Application No. PCT/EP2020/065759, mailed Oct. 8, 2020 (15 pgs.).

(Continued)

*Primary Examiner* — Jason L McCormack
(74) *Attorney, Agent, or Firm* — FINNEGAN, HENDERSON, FARABOW, GARRETT & DUNNER LLP

(57) ABSTRACT

Disclosed among other aspects is a charged particle inspection system including a phaseplate configured and arranged to modify the local phase of charged particles in a beam to reduce the effects of lens aberrations. The phaseplate is made up of an array of apertures with the voltage and/or a degree of obscuration of the apertures being controlled individually or in groups.

20 Claims, 16 Drawing Sheets

(58) Field of Classification Search
CPC .............. H01J 37/21; H01J 2237/0453; H01J 2237/1534; H01J 2237/2614
USPC ......................................... 250/306, 307, 311
See application file for complete search history.

(56) References Cited

U.S. PATENT DOCUMENTS

| | | | |
|---|---|---|---|
| 2010/0038537 A1* | 2/2010 | Benner ................ | H01J 37/26 250/311 |
| 2011/0139980 A1* | 6/2011 | Nakano ................ | H01J 37/26 250/307 |
| 2013/0099115 A1* | 4/2013 | Glaeser ................ | H01J 37/26 250/311 |
| 2014/0346354 A1* | 11/2014 | Verbeeck ........... | G01N 23/2251 250/397 |
| 2016/0189916 A1 | 6/2016 | Frosien et al. | |

FOREIGN PATENT DOCUMENTS

| | | |
|---|---|---|
| CN | 108962708 A | 12/2018 |
| JP | 2011187214 A | 9/2011 |
| TW | I286776 B | 9/2007 |
| TW | 201903399 A | 1/2019 |
| TW | 201907245 A | 2/2019 |
| WO | WO 2010/035386 A1 | 4/2010 |
| WO | WO 2019/076884 A1 | 4/2019 |

OTHER PUBLICATIONS

Office Action issued by the Intellectual Property Office (IPO) in related ROC (Taiwan) Patent Application No. 109121456, issued on Apr. 20, 2021 (17 pgs.).

Verbeeck, et al.; "Demonstration of a 2×2 programmable phase plate for electrons"; Ultramicroscopy, Jul. 2018 190; 58-65 (1 pg.).

* cited by examiner

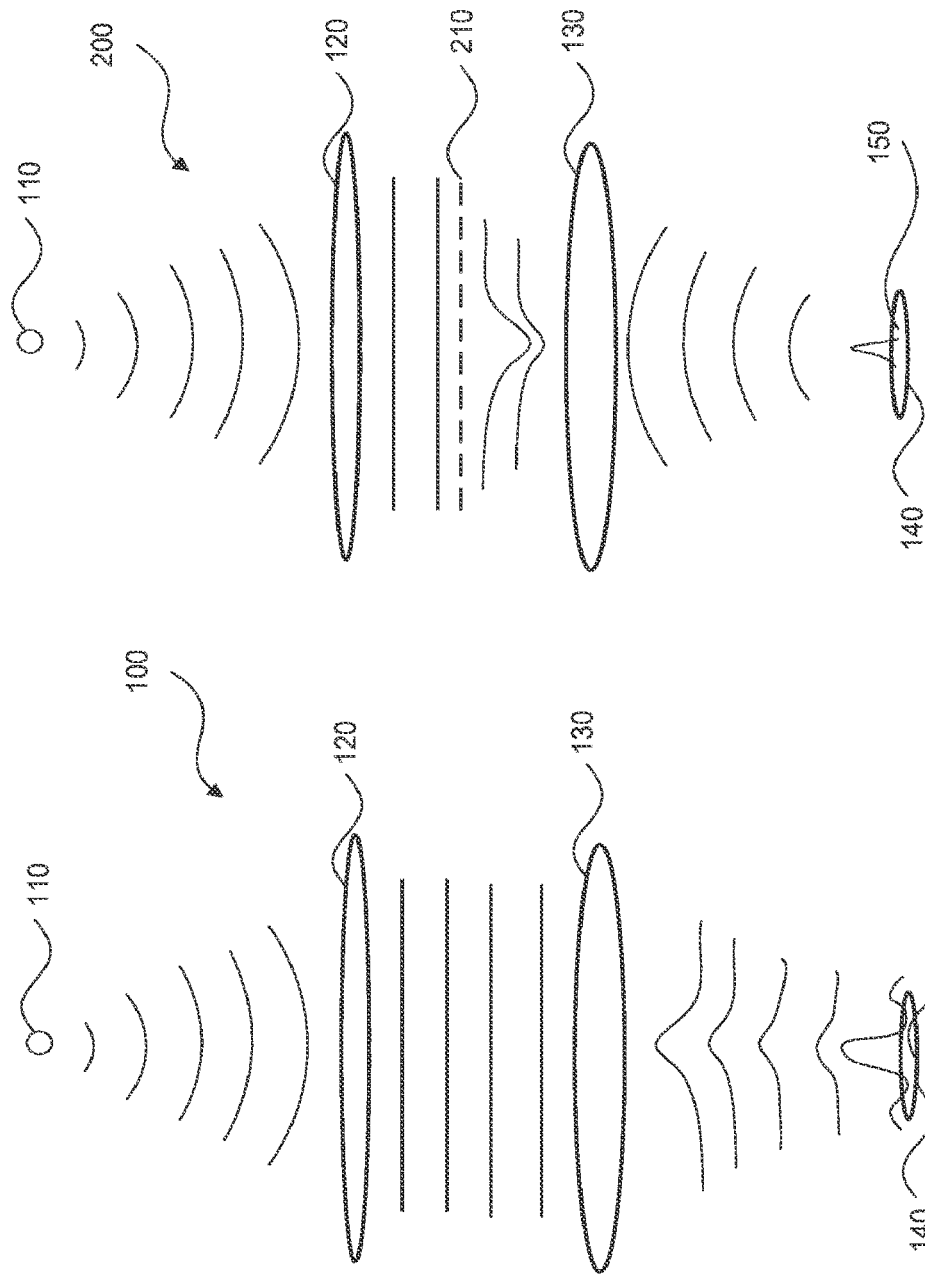

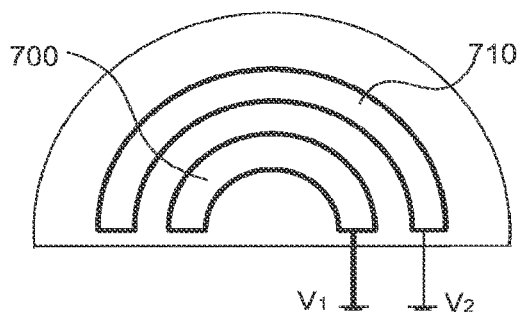
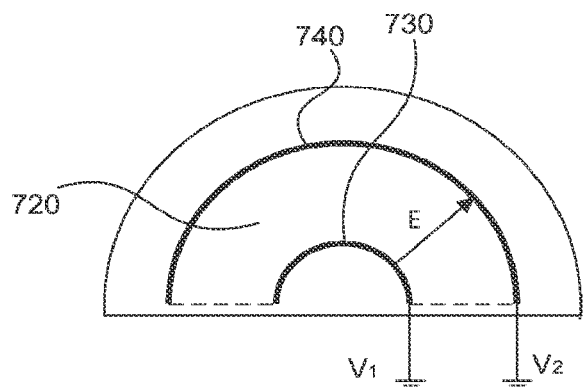
FIG. 15A  FIG. 15B
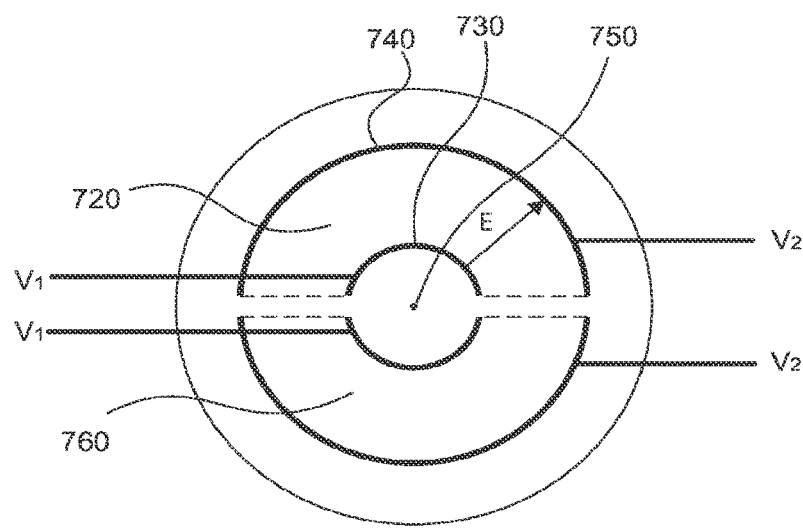
FIG. 15C

APPARATUS FOR AND METHOD OF LOCAL CONTROL OF A CHARGED PARTICLE BEAM

CROSS-REFERENCE TO RELATED APPLICATIONS

This application claims priority of International Application No. PCT/EP2020/065759, filed on Jun. 8, 2020, which claims priority of EP application 19183767.3, filed on Jul. 2, 2019, all of which are incorporated herein by reference in their entireties.

TECHNICAL FIELD

The embodiments described herein relate to a charged particle device with one or more charged particle beams, such as an electron microscopy apparatus utilizing one or more electron beams.

BACKGROUND

Integrated circuits are made by creating patterns on a wafer, also called a substrate. The wafer is supported on a wafer stage in the equipment for creating the pattern. One part of the process for making the integrated circuits involves looking at or "inspecting" parts of the wafer. This may be done with a charged particle system such as a scanning electron microscope or SEM.

Traditional microscopes use visible light and a transparent lens or lenses or reflective mirror(s) to render objects as small as about one micrometer visible. The resolving power of such a microscope is limited by the wavelength of the light used for illumination. Charged particle systems use a beam of charged particles instead of light, and use electromagnetic or electrostatic lenses to focus the particles. They can measure positions with a precision as small as one-tenth of a nanometer.

Charged particle systems include a column having elements analogous to those of a light microscope. The light source of the light microscope is replaced by a charged particle source, which is built into the column. Instead of glass lenses, a charged particle system has electromagnetic or electrostatic lenses. The power (focal length) of these lenses can be changed by changing the current through the lens coil or by changing the voltage of the electrodes. By analogy to light-based microscopes, arrangements to manipulate the beam, for example, by shaping it, focusing, it, or collimating it, are referred to as optical.

More specifically, the charged particle source may be imaged by a two lens optical system at a sample at the bottom of the column. With an ideal lens, charged particles would pass through the lens and come together at a single point in the image plane (or, more generally, the image surface). Real lenses, however, do not focus exactly to a single point. The second lens, for example, may distort the wavefront of the charged particle beam. These deviations from the idealized lens performance are called aberrations of the lens. Aberrations cause the image formed by a lens to be blurred or distorted. There is a need to minimize aberrations so that the image of the charged particle source on the sample is as focused as possible, so that the image of the sample is sharp and focused.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to some embodiments of the present disclosure, there is disclosed an apparatus for and method of reducing the effects of lens aberrations in a charged particle system.

Further features and advantages of the embodiments of the present disclosure, as well as the structure and operation of various embodiments of the present disclosure, are described in detail below with reference to the accompanying drawings. It is noted that the various embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF FIGURES

The accompanying drawings, which are incorporated herein and form part of the specification, illustrate examples of the embodiments of the present disclosure and, together with the description, further serve to explain the principles of the embodiments of the present disclosure and to enable a person skilled in the relevant art(s) to make and use the embodiments of the present disclosure.

FIGS. 2A and 2B are diagrams illustrating example principles, according to some embodiments of the present disclosure.

FIGS. 15A, 15B, and 15C are partially schematic plan views of example phaseplates, according to some embodiments of the present disclosure.

DETAILED DESCRIPTION

Figure 1:
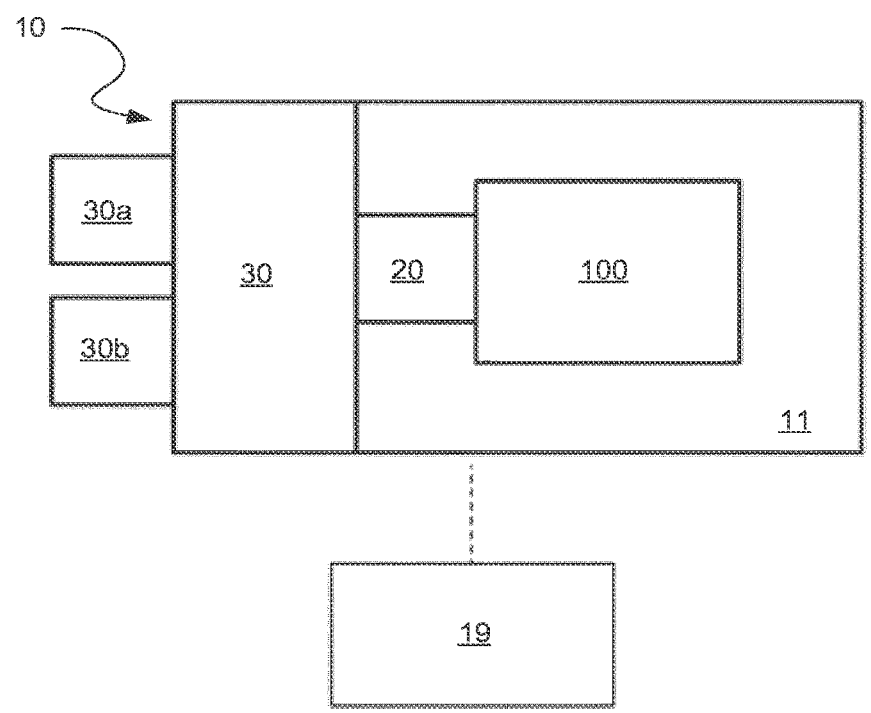
FIG. 1 is a block diagram of an example charged particle imaging system, according to some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of systems, apparatus, and methods consistent with aspects related to the disclose embodiments as recited in the appended claims. Relative dimensions of components in drawings may be exaggerated for clarity.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000 the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective then the process can be adjusted so the defect is less likely to recur.

As the name implies, SEMs use beams of electrons because such beams can be used to see structures that are too small to be seen by microscopes using light. The ability to see smaller structures is, however, limited by the fact that lenses are not truly capable of focusing the charged particle beam to a point on the sample. Instead, due to lens aberrations, the lens will distort the beam. There is a need to realize the full potential of increased resolution of an SEM by minimizing the effects of such lens aberrations. One of several disclosures in this application is a system and method in which the effects of lens aberrations are controlled by introducing one or more devices in the beam path that can adjust the beam locally, that is, at one or more locations in the beam cross section. These adjustments can offset the effects of lens aberrations. Of course, this is an approximate description, and the actual details are set forth more completely and precisely below.

Without limiting the scope of the present disclosure, descriptions and drawings of embodiments may be exemplarily referred to as using an electron beam. However, the embodiments are not used to limit the present disclosure to specific charged particles. For example, systems and methods for beam forming may be applied to photons, x-rays, and ions, etc. Furthermore, the term "beam" may refer to primary electron beams, primary electron beamlets, secondary electron beams, or secondary electron beamlets, among others.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

In the description and in the claims the terms "up," "down," "top," "bottom," "vertical," "horizontal," and like terms may be employed. These terms are intended to show relative orientation only and not any absolute orientation such as orientation with respect to gravity unless otherwise intended as indicated. Similarly, terms such as left, right, front, back, etc., are intended to give only relative orientation.

Reference is now made to FIG. 1, which illustrates a charged particle system in the form of an exemplary electron beam inspection (EBI) system 10, consistent with embodiments of the present disclosure. As shown in FIG. 1, EBI system 10 includes a main chamber 11, a load/lock chamber 20, an electron beam tool 100, and an equipment front end module (EFEM) 30. Electron beam tool 100 is located within main chamber 11.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples may be collectively referred to as "wafers" hereafter). One or more robotic arms (not shown) in EFEM 30 may transport the wafers to load/lock chamber 20.

Load/lock chamber 20 is connected to a load/lock vacuum pump system (not shown) that removes gas molecules in load/lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown), which removes gas molecules in main chamber 11 to reach a second pressure below the first pressure. After reaching the second pressure, the wafer is subject to inspection by electron beam tool 100. Electron beam tool 100 may be a single-beam system or a multi-beam system, or a multi-column system. A controller 19 is electronically connected to electron beam tool 100. While controller 19 is shown in FIG. 1 as being outside of the structure that includes main chamber 11, load/lock chamber 20, and EFEM 30, it is appreciated that controller 19 may be part of the structure.

While the present disclosure provides examples of main chamber 11 housing an electron beam inspection system, it should be noted that aspects of the disclosure in their broadest sense, are not limited to a chamber housing an electron beam inspection system. Rather, it is appreciated that the principles discussed herein may also be applied to other tools that operate under the second pressure.

FIG. 2A illustrates an exemplary electron beam tool 100 that may be part of the EBI system of FIG. 1. An electron beam tool 100 (also referred to herein as "apparatus 100") comprises an electron source 110, a first lens 120, and a second lens 130. Other components commonly present such as apertures and deflectors are not shown in FIG. 2A for the purpose of clarity. A sample 140 with sample surface 150 may be provided on a movable stage (not shown). Electron source 110, lens 120, and lens 130 may be aligned with a primary optical axis 160 of apparatus 100.

Electron source 110 may comprise a cathode (not shown) and an extractor or anode (not shown), in which, during operation, electron source 110 is configured to emit primary electrons from the cathode and the primary electrons are extracted or accelerated by the extractor or the anode to form a primary electron beam shown as a series of wavefronts, that is, surfaces, surface, real or imaginary, at which the phase of oscillation is the same. As can be seen, the wavefront of the beam as emitted by the source 110 is essentially spherical. The lens 120 acting as a condenser lens renders the wavefront substantially planar. Ideally the second lens, acting as an objective lens, will focus the wavefront onto the surface 150 thus imaging the source 110. However, aberration of the second lens 130 distorts the shape of the wavefront to deviate from an ideal shape, causing blurring of the image on the surface 150.

FIG. 2B shows an arrangement or apparatus 200 in which an element is introduced into the beampath to compensate for aberrations. Specifically, a phaseplate 210 is introduced between the lenses to pre-shape the wavefront so that the net effect of the pre-shaping and aberration is a properly focused beam. It will be understood as described in more detail below that the placement of the phaseplate 210 in the apparatus 200 is merely an example, and that the phaseplate 210 may be placed in other positions in the apparatus 200.

Also, in the examples described below, the phaseplate is described primarily in terms of correcting aberrations created by lenses. The phaseplate can also or alternatively, however, be used to shape the charged particle beam. For example, the phaseplate may be used to make the beam cross-sectional profile ring-shaped instead of spot-shaped on the sample. This may provide advantages in certain applications such as for imaging the side walls of contact holes. As another example, the beam profile could be made to diverge less at the wafer to create a larger depth-of-focus. For some applications full aberration correction with a phaseplate may not be possible with simultaneous special beam shaping with a phaseplate but the phaseplate could be tuned for an optimal trade-off for a given application.

Lens 110 may be a movable condenser lens that may be configured so that the position of its first principle plane is movable. The movable condenser lens may be configured to be magnetic, or electrostatic, or electromagnetic (e.g., compound). A movable condenser lens is further described in U.S. Pat. No. 9,922,799 and U.S. Patent Application Pub. No. 2017/0025243, both of which are incorporated herein in their entirety. In some embodiments, the condenser lens may be an anti-rotation lens, which may keep rotation angles of off-axis beamlets unchanged while varying the electric currents of the beamlets. In some embodiments, condenser lens may be a movable anti-rotation condenser lens, which involves an anti-rotation lens with a movable first principal plane. An anti-rotation or movable anti-rotation condenser lens is further described in International Application No. PCT/EP2017/084429, which is incorporated by reference in its entirety.

Figure 3A:
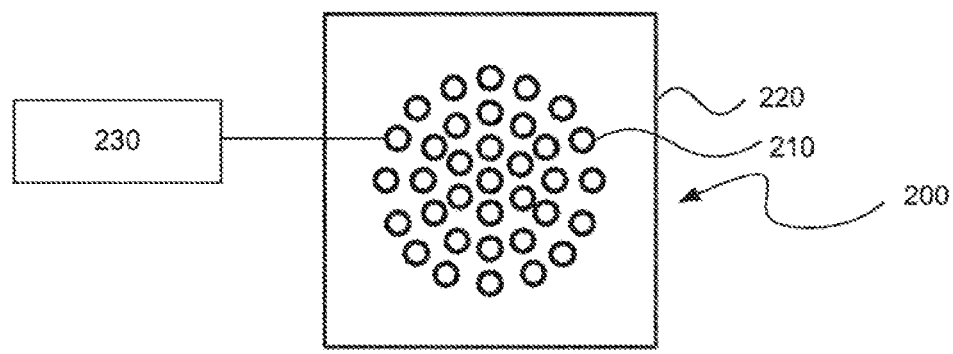
FIGS. 3A, 3B, 3C, and 3D are partially schematic plan views of example phaseplates, according to some embodiments of the present disclosure.

FIG. 3A illustrates an example of a phaseplate 200 such as may be used in the apparatus 200. As shown, the phaseplate 200 is configured as an array of apertures 210 in a plate member 220. The array in FIG. 3A is an arrangement of 35 apertures 210 arranged as a central aperture with concentric rings of 6, 12, and 16 apertures 210. It will be apparent that other arrangements may be used including square arrays, hexagonal arrays or random arrays or combinations of these. For some implementations it may be advantageous for the aperture pattern to have at least four-fold symmetry in azimuthal direction. For example, for a pattern comprising concentric circles, the number of apertures per concentric circle may be a multiple of at least four.

The apertures 210 may be round as shown or another suitable shape such as elliptical or rectangular. Apertures 210 having shapes differing from each other, such as a combination of round apertures and elliptical apertures, may arranged on the same plate member 220. The plate member 220 in the example shown may be square and planar as shown, or may be another suitable shape such as circular and the plate member 220 is not necessarily planar, for example, the plate member 220 may be curved to correspond to the curvature of the wavefront.

Each of the apertures of the apertures 210 in the phaseplate 200 has a separate voltage control 230 that is configured to establish a voltage in the aperture. The phaseplate 200 is thus programmable in that the voltages can be set differently for each aperture 210 or groups of apertures and can be changed as desired. Adjustment of the voltage changes the phase of the electron wave locally. If it is desired to have fewer voltage controls 230 then this can be achieved by providing fewer but larger apertures 210, or by connecting groups of apertures 210 to a common voltage control 230. As set forth below, according to another aspect, the degree of openness of the apertures can be controlled in a similar fashion, in which case the voltage control 230 can also or alternatively control the openness of the apertures.

For some implementations it is potentially advantageous to match the size of the apertures or segments of the phaseplate to the beam diameter with the smallest aperture that can impinge on the phaseplate. With the example of 3 rings with apertures or segments for the phaseplate and a minimum beam diameter of about 20 μm, then the aperture diameters or segment gaps should be in the order of 1 or a few μm. The wire routing design for the apertures or segments is more challenging with small dimensions, but the voltages needed are small and when segments instead of apertures are used the total number of wires needed will be smaller.

Figure 3B:
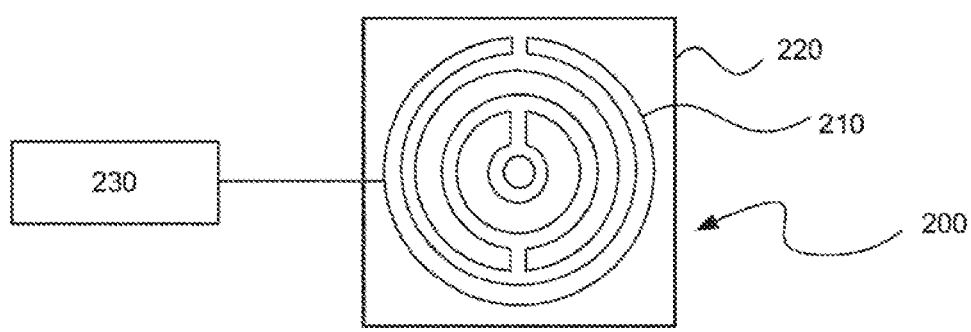
Figure 3C:
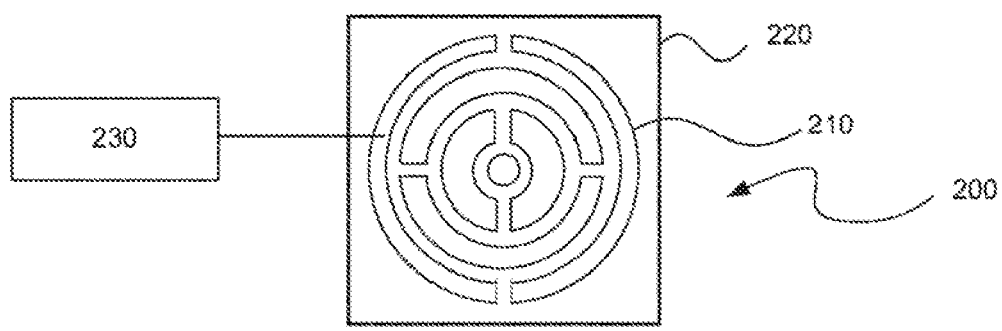
Figure 3D:
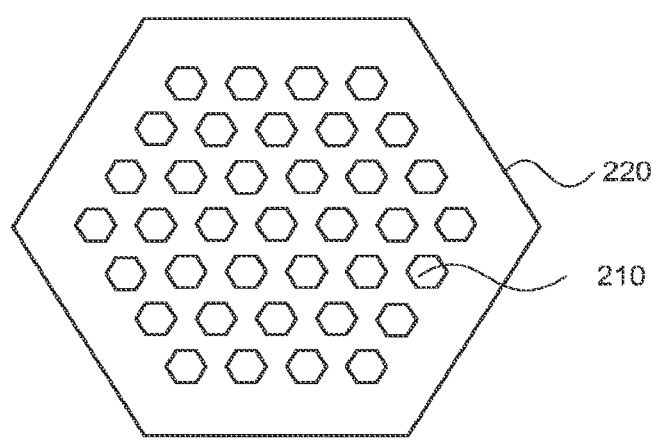

FIG. 3B shows an arrangement in which the apertures 210 are shaped as ring segments. In the specific example of FIG. 3B there is one segment per ring (i.e., one support). In the specific example of FIG. 3C there are two segments per ring (i.e., two supports). The supports may be used to carry electrical connections to electrodes in the apertures used to establish an electric field in the aperture. In certain implementations using segments instead of rings may provide the advantage of decreasing the number of voltage controls 230 needed (e.g., for use with axially symmetric aberrations) and may increase the transmission by using less support material for the phaseplate openings. The segment openings may be arranged as concentric rings around the optical axis (center of the plate 220) as shown. The rings may be divided into 1, 2 or more segment openings with mechanical supports between them. The ring width (extent in the radial direction) may differ from ring to ring. The segment openings in one or more rings may have the same voltage to further limit the number of voltage controls needed. The phaseplate 220 may be rotated during use to average out rotationally asymmetric contributions (e.g., due to the mechanical supports between segment openings) FIG. 3D shows an arrangement with hexagonal apertures 210 on a hexagonal phaseplate 220.

The mechanical stability of a phaseplate is mainly determined by its geometrical design. A final mechanical design will be a combination of maximum openness (high transmission) with sufficient mechanical interconnections between rings (for stiffness and thermal reasons, but also for wire routing). For phaseplates not positioned in or close to a focal plane SEM system performance will not be very sensitive to mechanical vibrations of the phaseplate.

During use, the focused electron beam is scanned across the surface of the sample. During scanning of a focused e-beam over a large field-of-view the shape and intensity distribution of the image of the source on the surface of the sample, the spot profile, may change. The use of a programmable phaseplate provides the ability to correct for or reduce these scanning effects we would like to control the programmable phaseplate dynamically. As set forth above the programmable phaseplate may be configured as a plate with apertures with a separate voltage control for each aperture. Using the voltage control to adjust the voltage at the aperture changes the phase of the electron wave locally, i.e., if the portion of the electron wave passing through the aperture, enables control of the control of the electron spot (probe) formation. As a specific example, synchronizing the phaseplate voltages with the scanning of the e-beam(s) over the sample enables dynamic control of the probe formation over the entire scanned field-of-view.

Scanning is performed by using deflectors that change the direction of the beam so the beam is sequentially aimed at different parts of the sample. The deflectors are controlled by a clock signal that synchronizes scanning. In some embodiments, the same clock signal used for scanning may be used for synchronizing the phaseplate voltages with the scanning system beam deflectors. The dynamic control may be limited to the voltages of a subset of the apertures of the phaseplate. The voltages used for dynamic control may be in addition to bias voltages used for apertures on the phaseplate, or phaseplates in the case of a system using multiple electron beams, known as a multibeam system.

The scan profile, that is, the pattern in which the beam scans the sample, can be any one of many choices. The scan profile may be a discontinuous, e.g., sawtooth, raster or typewriter type scan in which the beam is scanned in a series of lines across the sample. For dynamic phaseplate voltage control such a scan profile may be used. For some implementations it may be advantageous to combine the dynamic phaseplate voltage control with a continuous scan profile such as a meander-like, serpentine, or other similar scan profile for the beam(s) to limit voltage change rates on the phaseplate. That is, such a scan pattern reduces the need to change voltages because the scan is essentially continuous rather than discontinuous so fewer abrupt changes in voltages are required.

The synchronization of the phaseplate voltages with the scanning may be limited to only one scan direction of the beam(s). Also, as described more fully below, it is possible to control not only the voltage at the aperture but also its degree of obscuration, that is, whether the aperture freely permits a portion of the beam to pass through it or partially or wholly obstructs passage of the beam through a physical barrier or other means. The synchronization of the phaseplate voltages may be combined with synchronization of the open/partially open/closed distribution (the transmission distribution) of the phaseplate apertures.

The dynamic control of the phaseplate voltages may also be used to control the electron probe formation when scanning relatively small fields-of-view around different positions located at relative large distances from the optical axis. For one position at a relatively large distance from the optical axis the same phaseplate voltage distribution may be used when scanning the relatively small field-of-view around this position. The phaseplate voltage distribution may change only when the beam has been moved to a next position for scanning a relatively small field-of-view. In such a scenario the phaseplate voltage distribution would be changed once per small field-of-view.

Figure 4A:
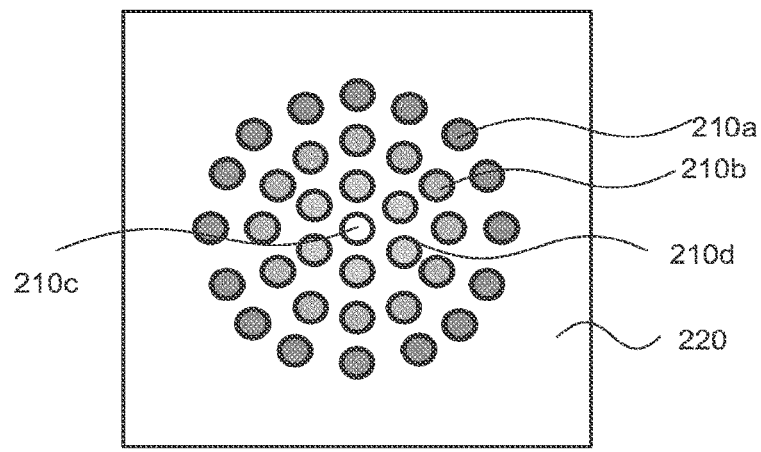
FIGS. 4A and 4B are partially schematic plan views of example phaseplates, according to some embodiments of the present disclosure.
Figure 4B:
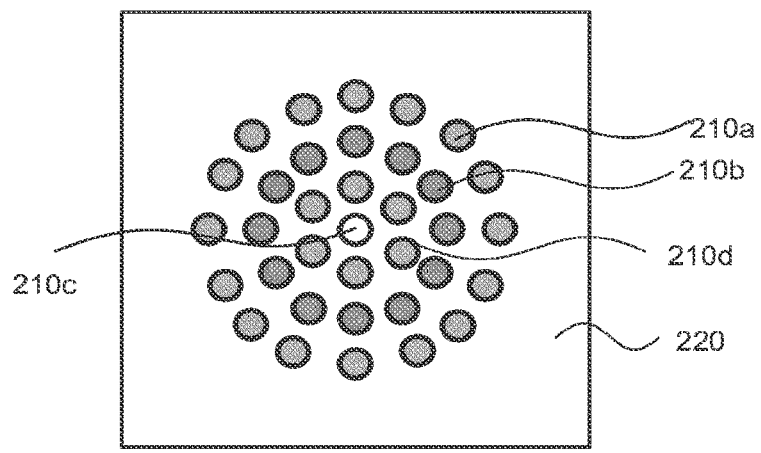

FIGS. 4A and 4B show an example of possible phase distributions of a programmable phaseplate for two different e-beam positions. FIG. 4A shows a possible phase distribution at the center of the field-of-view and FIG. 4B shows a possible phase distribution at a corner of the field-of-view, with the four gradations of grey representing four different phases, e.g., 0, $\pi/2$, $\pi$, and $3\pi/2$. In some implementations this may provide the advantage of improving the uniformity of the image quality over the field-of-view by correction or reduction of aberrations that cause the probe size to change over the field-of-view and so increasing the maximum allowable field-of-view by correction or reduction of aberrations over the field-of-view.

As mentioned, for enhanced e-beam correction it may be advantageous in some implementations to locally control the amplitude of the electron waves in addition to or instead of controlling the phase by controlling only the voltage at the aperture. It may be for some implementations that not all aberrations can be fully corrected with phase control only in a phaseplate. Local amplitude control changes the shape and symmetry of the beam profile. Adding amplitude control allows for a larger field of applications. It may be advantageous to add the functionality of adjusting the amplitude of the electron wave locally by combining and/or averaging over closed, partially closed and open apertures. The amplitude is programmable by varying the distribution of closed and open apertures, i.e., the openness or transmission distribution, over the phaseplate. This can be done independently of or in conjunction with local voltage control of phase.

Various means may be used to effect local control of beam obscuration, conversely, beam transmission. For example, beam blankers or deflectors could be added to or integrated into the phaseplate to obscure the apertures partially, wholly, or not at all. As another example, mechanical shutters could be added to or integrated into the phaseplate to obscure the apertures partially, wholly, or not at all. As another example, electrical mirrors could be added to or integrated into the phaseplate to obscure the apertures partially, wholly, or not at all.

Figure 5A:
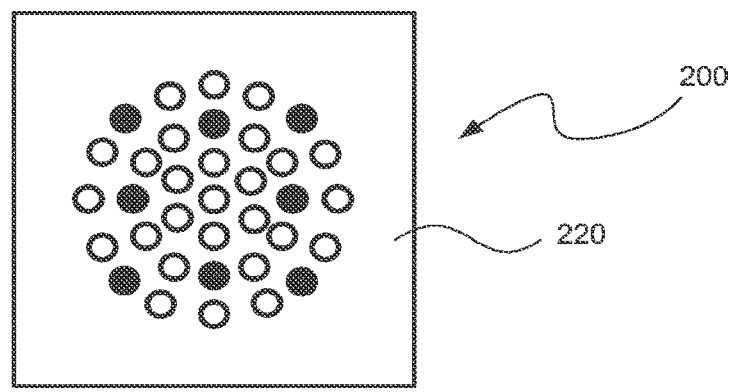
FIGS. 5A and 5B are partially schematic plan views of example phaseplates, according to some embodiments of the present disclosure.
Figure 5B:
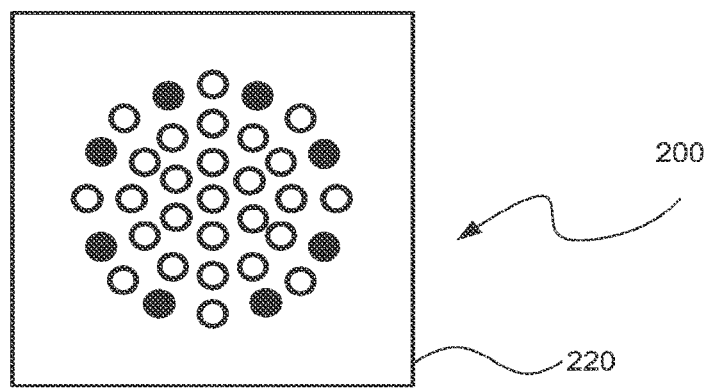

As another example, an additional plate with apertures and any or a combination of these devices could be positioned upbeam of (closer to the source than) or downbeam of (farther from the source than) the phaseplate. The additional plate may have more apertures than the phaseplate for better tuning of amplitude for a specific phaseplate aperture. As with the phaseplate, the apertures in the additional plate may be arranged in any one of a variety of patterns such as for example in concentric circles around the optical axis, a hexagonal pattern around the optical axis, or a rectangular pattern around the optical axis. Also, the apertures may have any shape or a combination of different shapes, such as, for example, round or elliptical. Also as with the phaseplate, for some implementations it may be advantageous for the aperture pattern to have at least four-fold symmetry in azimuthal direction. For example, for a pattern comprising concentric circles, the number of apertures per concentric circle may be a multiple of at least four. FIGS. 5A and 5B are examples of two different aperture distributions yielding different electron wave changes but having the same overall transmission. In both FIG. 5A and FIG. 5B eight of the 35 holes have been closed.

Thus, a plate with apertures can be used to attenuate the amplitude distribution of the wavefront instead of or in addition to controlling the phase distribution. For the sake of simplicity, a plate with apertures used to attenuate the amplitude distribution of the wavefront instead of or in addition to controlling the phase distribution is also referred to as a phaseplate.

There are several options for the incorporation of a phaseplate in a single- or multibeam-SEM system. The choice of option may be informed by various technical considerations. For example, regarding the location of the phaseplate with respect to other components of the system, for certain implementations it may be advantageous to position the phaseplate after the beam-limiting aperture(s) of the system because this is the part of the beam(s) generated by the source that will be imaged on the sample, and it is this part that will be optimized with the phaseplate so positioned. For certain implementations it may be advantageous to position the phaseplate out of the path of the secondary (or backscattered) electrons from the sample to the detector(s) to avoid loss of signal by secondary electrons hitting the phaseplate before reaching the detector. For certain implementations it may be advantageous in terms of ease-of-use of the phaseplate modelling and controlling to arrange the phaseplate so that a parallel beam impinges on the phaseplate. If the portion of the beam in which the phaseplate is positioned is converging or diverging, it may be advantageous for practical reasons (e.g., available volume) to locate the phaseplate far away from the (virtual) focal plane. The phaseplate may for example be located at or near a conjugate plane of the optical system.

Figure 6:
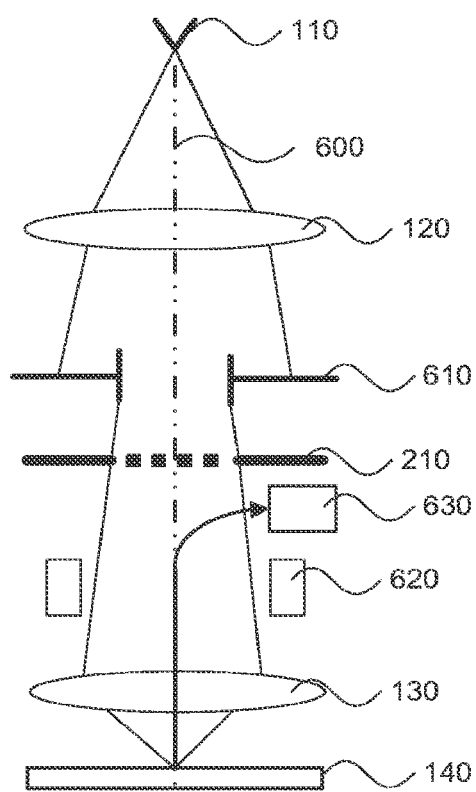
FIG. 6 is a schematic diagram of an example particle imaging system, according to some embodiments of the present disclosure.

In the configuration of FIG. 6 the phaseplate 210 is positioned between a beam-limiting aperture 610 and a Wien filter 620 that deviates the secondary electrons to a detector 630. This means that the beam 600 is divergent at the phaseplate 210. To control the beam current and the opening angle the aperture size is typically variable in a SEM. This means that the lateral dimensions of the phaseplate 210 should be large enough to span the entire width of the beam 600 as the beam 600 exits the beam limiting aperture 610 at the largest selectable beam limiting aperture size if it is desired to use the phaseplate 210 for the whole current range. If for the particular application under consideration the phaseplate 210 is only to be used under certain conditions, e.g., for lower beam currents, then it may be made retractable or folding and deployed only under those conditions. It would also be possible to use different phaseplate designs for different beam sizes and make them selectable by using a motorized strip just as is typically done with the aperture in a SEM.

Figure 7:
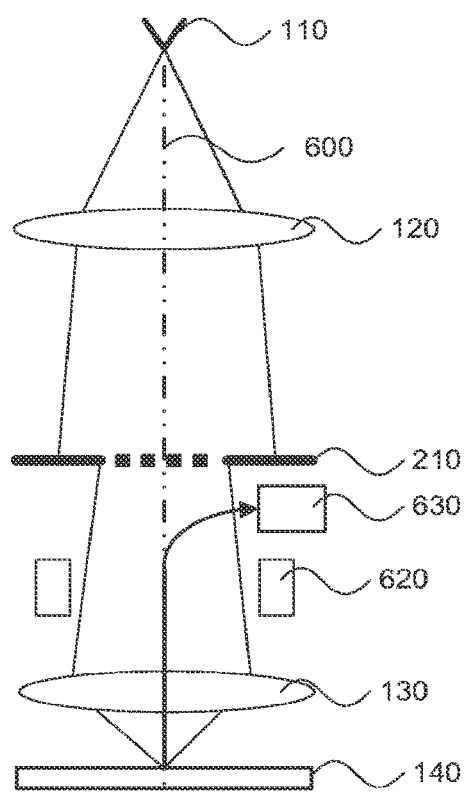
FIG. 7 is a schematic diagram of an example particle imaging system, according to some embodiments of the present disclosure.

FIG. 7 shows a second configuration for phaseplate placement in which the phaseplate 210 additionally performs the function of a beam defining element, removing the need for a separate beam limiting aperture. In this case the beam diameter and current can be varied by using different phaseplate designs for different beam sizes or by shutting down holes or segments of the phaseplate if needed (e.g., holes or segments of the outer rings in case a small beam diameter is wanted).

Figure 8:
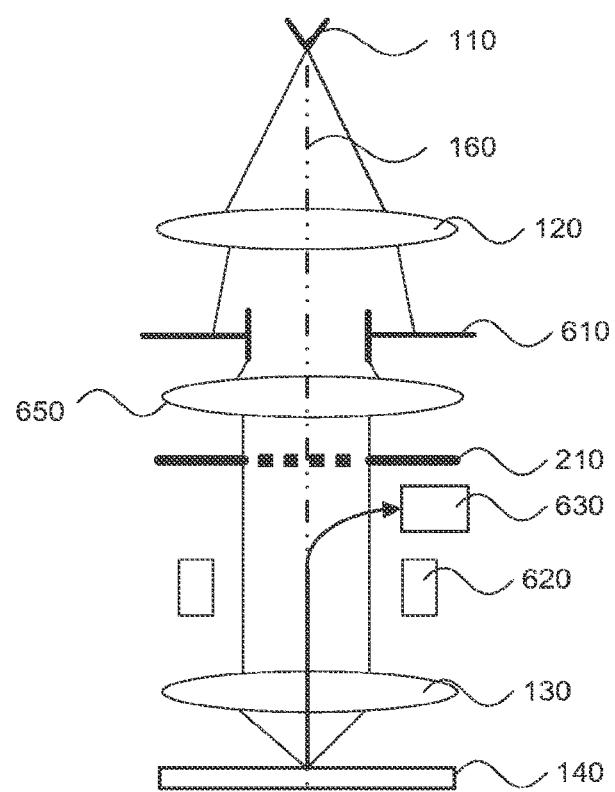
FIG. 8 is a schematic diagram of an example particle imaging system, according to some embodiments of the present disclosure.

In the configuration shown in FIG. 8 an additional lens is added between the beam limiting aperture 610 and the phaseplate 210 to create a parallel beam on the phaseplate 210. In this case the beam diameter at the phaseplate 210 is the same as the beam diameter in the objective lens 130, which means that the phaseplate is larger and that the hole diameters or segment gaps can be larger. All or part of the function of the lens 650 might also be achieved by using a large bias voltage on the phaseplate 210, the phaseplate 210 thus acting as part of an electrostatic lens. The possible additional aberrations created by the lens 650 might again be reduced by the phaseplate functionality.

Figure 9:
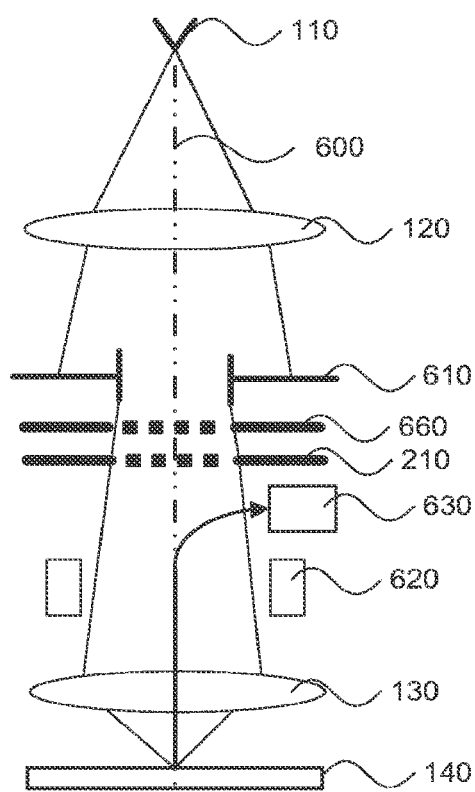
FIG. 9 is a schematic diagram of an example particle imaging system, according to some embodiments of the present disclosure.

As mentioned, for some implementations it may be advantageous to arrange a second plate in the system for local control of transmissivity. Such an arrangement is shown in FIG. 9, in which a second plate 650 is placed above (upbeam) from the phaseplate 210. Thus, the plate 650 controls local transmissivity while the phaseplate 210 controls local phase, providing an additional degree of control over beam shape and profile. As also mentioned, the plate 650 may have an aperture configuration matching or different from that of phaseplate 210.

The above described principles can also be applied to multi-beam systems. Due to off-axis aberrations the resolution of the beamlets in a multibeam system worsens for beamlets further away from the optical axis. This limits the maximum number of beamlets that can be generated for a given resolution specification. A programmable phaseplate may use separate apertures or groups of apertures for each beamlet in a multibeam system, enabling correction or reduction of aberrations (e.g., off-axis aberrations) for each beamlet individually.

The apertures of the phaseplates for all the beamlets may be distributed over mechanically separated plates or may be distributed over one large plate. The separated plates may be at different positions along the optical axis of the e-beam system (i.e., at different positions along the general traveling direction of the electrons).

The separated plates may be at different angles with respect to each other. The plate(s) used for amplitude control may be separate plates, and may be positioned above or below the plates used for phase control. The plate(s) may for example be located at or near a conjugate plane of the e-beam optical system.

The voltage distribution over the apertures may be different for each group of apertures assigned for a particular beamlet or for each plate. Voltages distributions may be the same for certain groups of apertures or plates to limit the number of separate voltage controls needed. The aperture transmissivity distribution over open, closed and partially closed apertures may be different for each group of apertures assigned for a particular beamlet for each plate. The aperture distributions for the different beamlets may be chosen such that for all beamlets the overall transmission of their individual aperture distribution is the same, so that the beamlet current can be the same for all beamlets.

The voltage and open/close aperture transmissivity distributions over the apertures may be adjusted as a function of the landing energy of the beamlets to enable correction or reduction of aberrations at the different e-beam system settings related to different landing energies. The voltage and open/close aperture distributions over the apertures may be adjusted as a function of the position of the beamlets on the sample. For example, the position of the beamlet could be a measure of whether or the what extent the beamlet is off-axis to optimize correction or reduction of aberrations at various off-axis positions of the beamlets.

The voltage and transmission distributions over the apertures may be adjusted as a function of the beam current of the beamlets to enable correction or reduction of aberrations at the different e-beam system settings related to different beamlet currents. The voltage and open/close aperture distributions over the apertures may be adjusted as a function of the landing angle of the beamlets at the sample to enable correction or reduction of aberrations at the different e-beam system settings related to different landing angles.

The voltage and open/close aperture (amplitude) distributions over the apertures may be adjusted as a function of the electrical field at the sample to enable correction or reduction of aberrations at the different e-beam system settings related to different electrical fields at the sample.

The voltage and amplitude distribution may also and/or alternatively be adjusted as a function of landing energy, beam current, landing angle and electric field for a single beam.

Using programmable phaseplate control for individual beamlets allows aberration correction or reduction for each beamlet. Using phaseplate phase and amplitude control allows for a larger field of applications than with phase control only.

Figure 10:
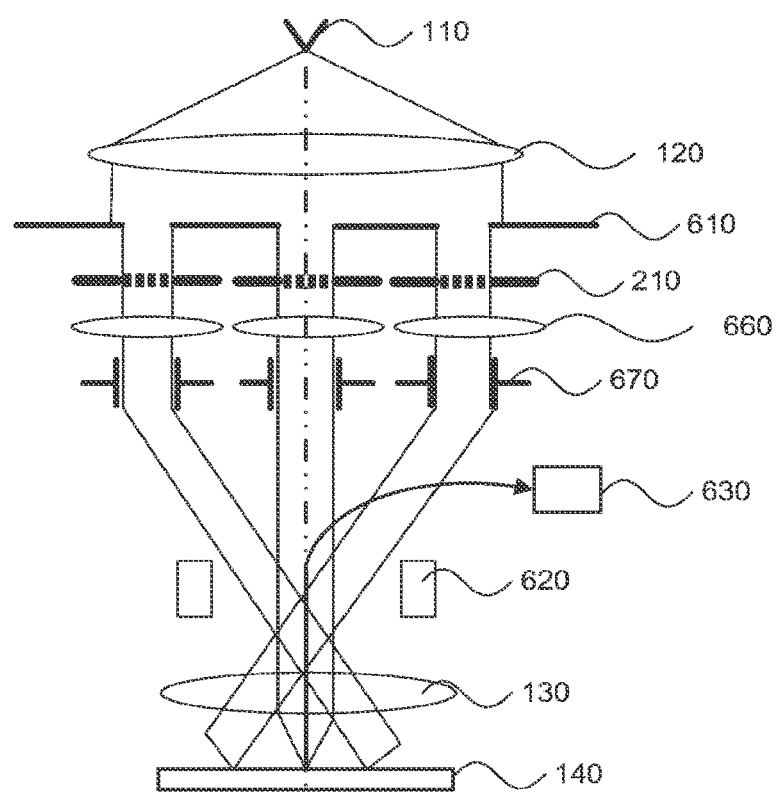
FIG. 10 is a schematic diagram of an example particle imaging system, according to some embodiments of the present disclosure.

FIG. 10 shows as an example one possible arrangement incorporating phaseplates in a multibeam SEM system. Because the aberrations can be different for different beamlets (due to off-axis aberrations), the depicted implementation provides individual phaseplate functionality for each beamlet. In the system on of FIG. 10 the phaseplates 210 are positioned between the beam-limiting apertures 610 and combination of lenslets 660 the micro-deflectors 670 used to create and steer the beamlets of the multibeam system. In this way the phaseplate manufacturing can be incorporated into the whole MEMS manufacturing process for the multibeam aperture arrays. It also has the advantage that parallel beams are impinging on the phaseplates 210 for the different beamlets.

Figure 11:
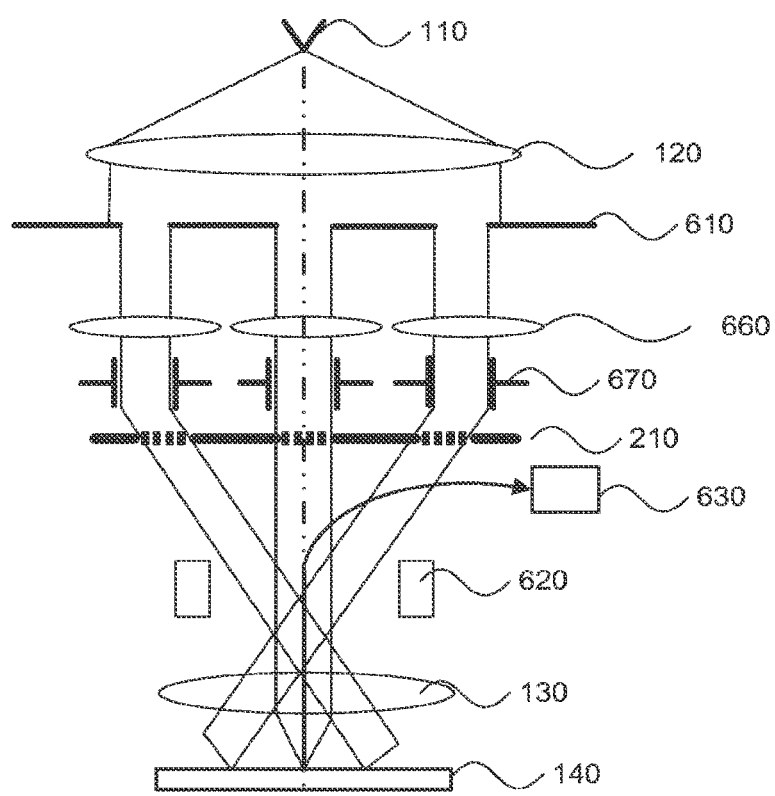
FIG. 11 is a schematic diagram of an example particle imaging system, according to some embodiments of the present disclosure.

In the system shown in FIG. 11 the phaseplates 210 are positioned below the lenslets 660 and MEMS aperture arrays with the beam-limiting apertures 670 and deflectors 670. In this way the phaseplates 210 can form a mechanically independent group of elements, that could be manufactured in a separate and possibly different way than the beamlet-generating MEMS arrays. The phaseplate group could be retractable or folding if not needed for some applications, or movable to be able to choose between different sets of phaseplate geometries on a larger plate.

All of the description above concerning phaseplates, including geometries, voltage control at the apertures, transmissivity control at the apertures, grouping of apertures, use of multiple plates, is applicable to the deployment of phaseplates in a multibeam system.

Figure 12:
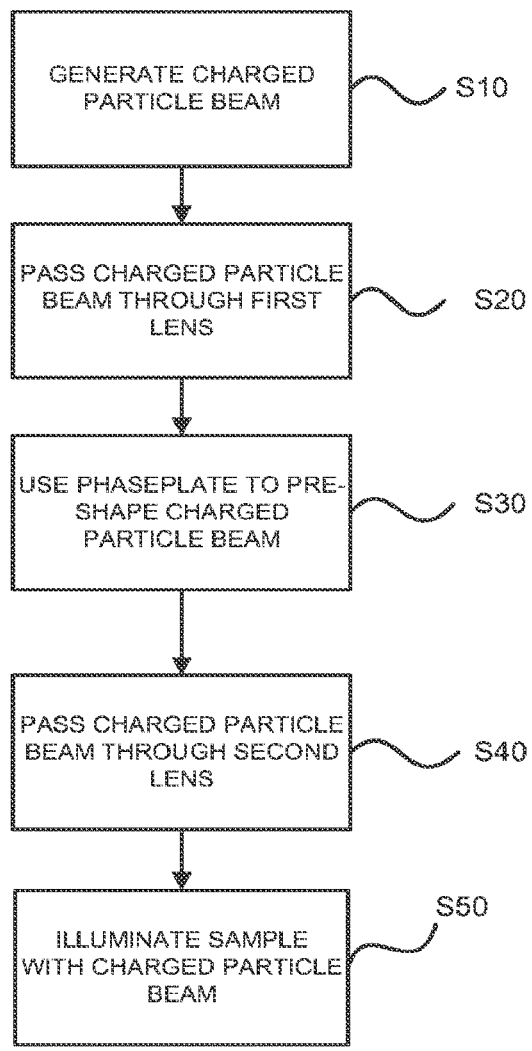
FIG. 12 is a flowchart illustrating an example method of using a charged particle imaging system, according to some embodiments of the present disclosure.

According to some embodiments, there is disclosed a method of using a phaseplate to exert local control over portions of a cross section of a charged particle beam. With reference to FIG. 12 in a first step S10 the charged particle beam is generated. Then, in a step S20, the beam is passed through a first lens. Then in a step S30 the phaseplate is used to perform local control of the beam phase, in essence pre-shaping the beam. In a step "clipped", that is, passed through an aperture. In a step S40 the pre-shaped beam is passed through an second lens. The net result of the beam being pre-shaped and passed through the objective lens is that the pre-shaping corrects aberrations of the objective lens. In a step S50 the beam is used to illuminate a sample.

Figure 13:
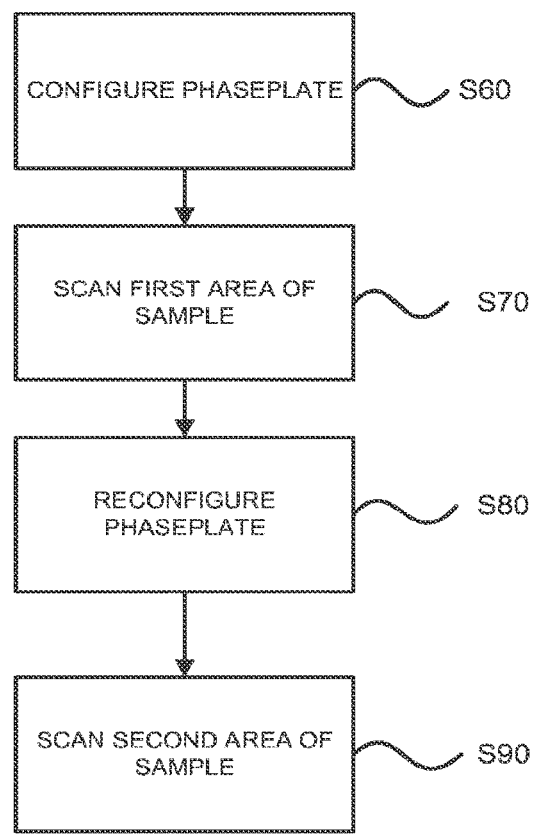
FIG. 13 is a flowchart illustrating an example method of using a charged particle imaging system, according to some embodiments of the present disclosure.

FIG. 13 is a flowchart describing a method of dynamically configuring a phaseplate as a function of which area of a sample is being scanned. In a step S60 the phaseplate is configured to have a first distribution of phases, transmissivities, or both. In a step S70 a first area of a sample is scanned with a charged particle beam that has passed through the phaseplate having the first distribution. In a step S80 the phaseplate is configured to have a second distribution of phases, transmissivities, or both. In a step S90 a second area of a sample is scanned with a charged particle beam that has passed through the phaseplate having the second distribution.

Figure 14:
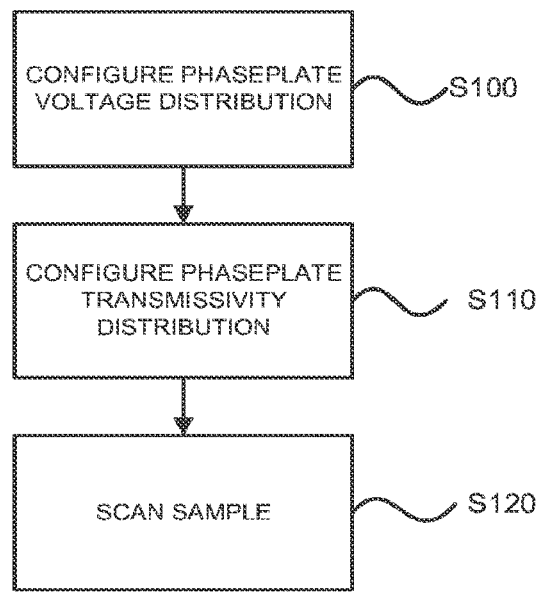
FIG. 14 is a flowchart illustrating an example method of using a charged particle imaging system, according to some embodiments of the present disclosure.

FIG. 14 is a flowchart showing a method of using a phaseplate configured for local control of phase and transmissivity to scan a sample. In a step S100 the phaseplate is configured with a desired aperture voltage distribution. In a step S110 the phaseplate is configured with a desired aperture transmissivity distribution. It will be apparent to one of ordinary skill in the art that the order of these two steps may be reversed. In a step S120 the sample is scanned by passing a charged particle beam through the phaseplate.

The above description is in terms of phaseplate with apertures, e.g., in the form of rings of round holes or curved segments around a central hole with separate voltage and/or shutter control for each hole or segment. In the case of voltage control, arrangements are described in which each hole or segment is supplied with a single voltage. According to the demands of a particular application, however, it may be advantageous to supply each aperture with two or more voltages. In this way an electric field with a gradient can be created over the opening of the hole or segment, giving the opportunity of better tuning the shape of the wave front locally, instead of achieving this by the use of several discrete small holes or segments with an electric field having a single voltage.

Thus, as shown in FIG. 15A, the aperture arrangement in the phaseplate may comprise, for example, two curved segments 700 and 710, with a first voltage V1 being applied to the curved segment 700 and a second voltage V2, which may or may not be different from V1, being applied to the segment 710. As shown in FIG. 15B, the aperture arrangement in the phaseplate may comprise, for example, a curved segment 720 with a first voltage V1 being applied to the inner side electrode 730 of curved segment 720 and a second voltage V2, different from the first voltage V1, being applied to an outer side electrode 740 of the curved segment 720, to create a radial gradient in the electric field E over the segment between the electrodes. The curved segment may be concentric with an optical axis 750 of the imaging system. In general there may be another ring segment 760 arranged symmetrically with respect to the optical axis 750.

The radial variation of the wave front is typically a significant contributor to aberrations in a charged particle imaging system, and by using an adjustable radial gradient the wave front can be better controlled with an electric field that varies smoothly in the radial direction. For some applications this may reduce the need for multiple curved concentric segments with small radial openings causing discrete steps in the radial wave shape. It may also reduce the complexity of the phaseplate design and allows for increased transmission as less material may be needed and larger openings may be possible. The two voltages on a curved segment may be separated at its outer ends as shown. For some applications it may be advantageous to avoid charging of the electric separation part (as in the MEMS structures used for multibeam systems).

The embodiments may further be described using the following clauses:

1. A programmable phaseplate for a charged particle beam imaging system, the phaseplate comprising:
 a plate-shaped member;
 a plurality of apertures arranged in the plate-shaped member; and
 a plurality of aperture control members respectively associated with each of the plurality of apertures, each aperture control member being arranged to control an interaction of the associated aperture with charged particles at the aperture.

2. The programmable phaseplate of clause 1 wherein the plurality of apertures comprises a plurality of arcuate apertures in the plate shaped member.

3. The programmable phaseplate of clause 1 wherein the plurality of apertures comprises a plurality of ring segment apertures in the plate-shaped member.

4. The programmable phaseplate of clause 1 wherein the ring segments are formed by a plurality of segments separated by mechanical supports, and wherein the mechanical supports comprise electrical contacts for providing voltage to electrodes at the apertures.

5. The programmable phaseplate of clause 1 wherein the plurality of apertures comprises a plurality of circle segment shaped apertures in the plate-shaped member arranged in at least two concentric circles.

6. The programmable phaseplate of clause 1 wherein a number of apertures per concentric circle is a multiple of at least 4.

7. The programmable phaseplate of clause 1 wherein the radial width of the aperture is in a range of about 10 microns to less than one micron 8. The programmable phaseplate of clause 1 wherein a radial width of the apertures varies ring-to-ring.

9. The programmable phaseplate of clause 1 wherein the means connected to at least one of the apertures for interacting with the charged particle beam comprises means electrically connected to the at least one aperture for altering an electric field at the aperture.

10. The programmable phaseplate of clause 1 wherein a subset of the apertures have a common voltage.

11. The programmable phaseplate of clause 1 wherein the means connected to at least one of the apertures for interacting with the charged particle beam comprises means connected to the at least one aperture for selectively obstructing passage of the charged particle beam through the aperture.

12. The programmable phaseplate of clause 11 wherein the means for selectively obstructing the aperture is controllable to fully block the aperture, partially block the aperture, or leave the aperture unblocked.

13. The programmable phaseplate of clause 11 wherein a degree of available obstruction is in the range of 0% to 100%.

14. The programmable phaseplate of clause 11 wherein a distribution of aperture obstruction comprises a distribution of closed, partially closed and open apertures.

15. The programmable phaseplate of clause 11 wherein an amplitude of an electron wave is varied in a cross section of the beam by controlling a distribution of aperture obstruction.

16. The programmable phaseplate of clause 1 wherein the phaseplate has an axis of symmetry and further comprising means for rotating the phaseplate around the axis of symmetry.

17. The programmable phaseplate of clause 1 wherein the apertures are round.

18. The programmable phaseplate of clause 1 wherein the apertures are elliptical.

19. The programmable phaseplate of clause 1 wherein the apertures are rectangular.

20. The programmable phaseplate of clause 1 wherein the aperture shapes vary over the phaseplate.

21. The programmable phaseplate of clause 1 or clause 20 wherein the aperture sizes vary over the phaseplate.

22. The programmable phaseplate of clause 1 wherein an aperture pattern comprises a circular pattern.

23. The programmable phaseplate of clause 1 wherein an aperture pattern comprises a square pattern.

24. The programmable phaseplate of clause 1 wherein an aperture pattern comprises an polygonal pattern.

25. A system for imaging a charged particle beam comprising
 a source of a beam of charged particles; and
 a programmable phaseplate arranged to receive the beam.

26. The system of clause 25 wherein the phaseplate is located at or near a conjugate plane of the system.

27. The system of clause 25 wherein the programmable phaseplate comprises a plurality of segment-shaped apertures arranged in concentric rings around an optical axis of the system.

28. The system of clause 25 wherein the apertures are arranged in a hexagonal pattern around an optical axis of the system.

29. The system of clause 25 wherein the phaseplate is movable in and out of a path of the beam.

30. The system of clause 25 wherein the phaseplate includes a plurality of beam blankers integrated into the phaseplate, the beam blankers being arranged such that each beam blanker is capable of blanking a portion of the charged particle beam at a respective aperture.

31. The system of clause 25 further comprising a plurality of MEMS aperture arrays, the MEMS aperture arrays including beam-limiting apertures, lenses and deflectors, wherein the phaseplate is positioned downbeam of the MEMS aperture arrays.

32. The system of clause 25 wherein the phaseplate includes a plurality of deflectors integrated into the phaseplate, the deflectors being arranged such that each deflector is capable of deflecting a portion of the charged particle beam at a respective aperture.

33. The system of clause 25 wherein the phaseplate includes a plurality of mechanical shutters integrated into the phaseplate, the shutters being arranged such that each shutter is capable of at least partially obstructing a portion of the charged particle beam at a respective aperture.

34. The system of clause 25 wherein the phaseplate comprises a plurality of electrical mirrors integrated into the phaseplate, the electrical mirrors being arranged such that each electrical mirror is capable of reflecting at least a portion of the charged particle beam at a respective aperture 35. The system of clause 25 further comprising at least one of an additional blanker plate, deflector plate, shutter plate or mirror plate upbeam of the phaseplate 36. The system of clause 25 further comprising at least one of an additional blanker plate, deflector plate, shutter plate or mirror plate downbeam of the phaseplate.

37. The system of clause 25 comprising a first phaseplate configured to provide control of one of a cross-sectional amplitude distribution of the beam and a cross-sectional phase distribution of the beam and a second phaseplate configured to provide control of the other of a cross-sectional amplitude distribution of the beam and a cross-sectional phase distribution of the beam.

38. The system of clause 37 wherein the first phaseplate plate has a different number of apertures than the second phaseplate.

39. The system of clause 37 wherein the apertures on the first phaseplate plate have a first shape and the apertures on the second phaseplate have a second shape different from the first shape.

40. The system of clause 37 wherein the apertures on the first phaseplate plate have a first size and the apertures on the second phaseplate have a second shape different from the first shape.

41. The system of clause 37 wherein the apertures on the first phaseplate plate have a first distribution and the apertures on the second phaseplate have a second distribution different from the first distribution.

42. A system for imaging a charged particle beam comprising
a source of a beam of charged particles;
a beam limiting aperture arranged to receive and shape the beam of charged particles; and
a programmable phaseplate arranged downbeam of the beam limiting aperture and to receive the beam after the beam has been shaped by the beam limiting aperture.

43. A system for imaging a charged particle beam, the system comprising:
a source of a charged particle beam;
a lens for shaping the beam into a shaped beam; and
a programmable phaseplate arranged downbeam of the lens means to receive the shaped beam.

44. The system of clause 43 wherein the beam diameter at the phaseplate is the same as the beam diameter on the lens.

45. A system for imaging a charged particle beam, the system comprising
a source of a charged particle beam; and
a phaseplate configured to function as a beam defining element and as an element for controlling the relative phase of portions of a cross section of the beam.

46. The system of clause 45 further comprising a lens arranged between the beam limiting aperture and the phaseplate to control the beam divergence on the phaseplate.

47. The system of clause 45, wherein the phaseplate comprises a plurality of controlled aperture elements, each aperture element comprising an aperture and a voltage control arranged to control an electric field at the aperture.

48. A system for imaging a plurality of charged particle beamlets, the system comprising
a source of a plurality of beamlets of charged particles; and
a programmable phaseplate arranged to receive at least one of the beamlets.

49. The system of clause 48, wherein the programmable phaseplate is arranged to receive multiple beamlets and has a plurality of controlled aperture elements and wherein each beamlet has an associated group of controlled aperture elements.

50. The system of clause 48 wherein each beamlet has an associated phaseplate.

51. The system of clause 50 wherein the associated phaseplates are arranged at different positions along an optical axis of the system.

52. The system of clause 50 wherein the associated phaseplates are arranged at different positions along a direction of beamlet propagation.

53. The system of clause 50 wherein the associated phaseplates are at different angles with respect to each other.

54. The system of clause 50 comprising a first plurality of phaseplates configured to provide control of the cross-sectional amplitude distribution of the beamlets and a second plurality of phaseplates configured to provide control of the cross-sectional phase distribution of the beamlets.

55. The system of clause 54 wherein the first plurality of phaseplates is positioned upbeam of the second plurality of phaseplates.

56. The system of clause 54 wherein the first plurality of phaseplates is positioned downbeam of the second plurality of phaseplates.

57. The system of clause 48 further comprising
at least one beam-limiting aperture; and
at least one micro-deflector;
and wherein the programmable phaseplate is positioned between the at least one beam-limiting aperture and the at least one micro-deflector.

58. The system of clause 50 wherein an aperture pattern varies phaseplate to phaseplate.

59. The system of clause 50 wherein a number of apertures varies phaseplate to phaseplate.

60. The system of clause 50 wherein a voltage distribution over the apertures is different for each group of apertures assigned for a particular beamlet.

61. The system of clause 50 wherein a voltage distribution over the apertures is different for each phaseplate.

62. The system of clause 50 wherein a voltage distribution is the same for a first group of apertures.

63. The system of clause 50 wherein a voltage distribution is the same for a first group of plates.

64. The system of clause 50 wherein the plurality of apertures comprises a first set of apertures having a first degree of openness and a second group of apertures having a second degree of openness, the first group being arranged in a path of a first beamlet and the second group being in a path of a second beamlet.

65. The system of clause 50 wherein the a first group of apertures is arranged in a path of a first beamlet and a second group of apertures is arranged in the path of a second beamlet, and wherein a first openness distribution of the apertures in the first group and a second openness distribution of the apertures in the second group is selected such that a magnitude of a first beam current of the first beamlet is the same as a magnitude of a second beam current of the second beamlet.

66. The system of clause 52 wherein the voltage and openness aperture distributions over the apertures is adjusted based at least in part on the landing energy of the beamlets.

67. The system of clause 52 wherein a voltage and an openness aperture distribution is adjusted based at least in part on at least one of a distance between beamlets or a distance from a beamlet to an optical axis.

68. The system of clause 52 wherein at least one of a voltage distribution and an openness distribution over the apertures is adjusted based at least in part on a beam current of the beamlets.

69. The system of clause 52 wherein at least one of a voltage distribution and an openness aperture distributions is adjusted as a function of a landing angle of the beamlets at the sample.

70. The system of clause 52 wherein at least one of a voltage distribution and an openness aperture distributions is adjusted as a function of a magnitude of an electric field at the sample.

71. A system for imaging a charged particle beam, the system comprising:
a phaseplate comprising a plurality of apertures, at least one of the apertures having a voltage control to determine an aperture voltage; and
means for synchronizing the aperture voltages or amplitudes with scanning of at least one charged particle beam over a sample to dynamically control probe formation over an entire scanned field-of-view.

72. The system of clause 71 further comprising
clock means for generating a clock signal, the clock signal being applied to synchronize the aperture voltages with voltages applied to scan the beam.

73. The system of clause 71 wherein the beam is scanned using a discontinuous scan profile.

74. The system of clause 71 wherein the beam is scanned using a continuous scan profile.

75. The system of clause 71 wherein the aperture voltage distribution is synchronized in only one scan direction of the beam.

76. The system of clause 71 further comprising a voltage source arranged to provide a bias voltage applied in addition to a voltage applied by the voltage control for synchronizing with scanning of the beam'

77. The system of clause 71 wherein synchronization of the phaseplate voltages or amplitudes is performed in combination with synchronization of an openness distribution of the phaseplate apertures.

78. A method of imaging a charged particle beam, the method comprising the steps of:
scanning fields-of-view around a plurality of different positions located at respective relatively large distances from an optical axis of a charged particle beam system; and
dynamically controlling voltages in or amplitudes of apertures of a phaseplate to control electron probe formation.

79. A method of imaging a charged particle beam, the method comprising the steps of
scanning a first portion of a sample at a first position at an optical axis or off an optical axis of a charged particle beam system with a distribution of aperture voltages or amplitudes of a phaseplate; and
scanning a second portion of the sample at a second position off the optical axis with a second distribution of aperture voltages or amplitudes of a phaseplate.

80. The method of clause 79 wherein the voltage and openness aperture distributions over the apertures is adjusted based at least in part on the landing energy of the beamlets.

81. The method of clause 79 wherein at least one of a voltage distribution and an openness distribution over the apertures is adjusted based at least in part on a beam current of the beamlet.

82. The method of clause 79 wherein at least one of a voltage distribution and an openness aperture distributions is adjusted as a function of a landing angle of the beamlet at the sample.

83. The method of clause 79 wherein at least one of a voltage distribution and an openness aperture distributions is adjusted as a function of a magnitude of the electric field at the sample.

84. A programmable phaseplate for a charged particle beam imaging system, the phaseplate comprising:
a plate-shaped member;
structure defining an aperture arranged in the plate-shaped member, the structure having a first electrically conducting portion and a second electrically conducting portion electrically insulated from the first electrically conducting portion;
a first voltage source arranged to apply a first voltage to the first electrically conducting portion; and
a second voltage source arranged to apply a second voltage different from the first voltage to the second electrically conducting portion; and.

85. The programmable phaseplate of clause 84 wherein the structure defining an aperture comprises structure defining a ring-shaped semicircular segment having an inner edge and an outer edge.

86. The programmable phaseplate of clause 85 wherein the ring-shaped semicircular segment is concentric with an optical axis of the charged particle beam imaging system.

87. The programmable phaseplate of clause 85 wherein the first electrically conducting portion comprises the inner edge and the second electrically conducting portion comprises the outer edge.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the embodiments of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The invention claimed is:

1. A programmable phaseplate for a charged particle beam of an imaging system, the programmable phaseplate comprising:
plate member;
a plurality of apertures arranged in the plate member and configured to be disposed in a path of the charged particle beam such that each aperture of the plurality of apertures is configured to interact with a respective local portion of the charged particle beam; and
a plurality of aperture control members configured to separately control individual ones of the apertures or groups of the apertures to control an interaction of each aperture with the respective local portion of the charged particle beam and reduce lens aberration of a wavefront of the charged particle beam.

2. The programmable phaseplate of claim 1, wherein the plurality of apertures comprises a plurality of arcuate apertures in the plate member.

3. The programmable phaseplate of claim 1, wherein the plurality of apertures comprises a plurality of ring segment apertures in the plate member.

4. The programmable phaseplate of claim 3, wherein the ring segment apertures comprises ring segments that are formed by a plurality of segments separated by mechanical supports, and wherein the mechanical supports comprise electrical contacts for providing voltage to electrodes at the apertures.

5. The programmable phaseplate of claim 1, wherein the plurality of apertures comprises a plurality of circle segment shaped apertures in the-plate member arranged in at least two concentric circles.

6. The programmable phaseplate of claim 5, wherein a number of apertures per concentric circle is a multiple of at least 4.

7. The programmable phaseplate of claim 1, wherein a radial width of an aperture of the plurality of apertures is in a range of about 10 microns to less than one micron.

8. The programmable phaseplate of claim 3, wherein a radial width of the apertures varies ring-to-ring.

9. The programmable phaseplate of claim 1, further comprising:
a means connected to at least one aperture of the plurality of apertures for interacting with the charged particle beam comprises means electrically connected to the at least one aperture for altering an electric field at the at least one aperture.

10. The programmable phaseplate of claim 1, wherein a subset of the apertures of the plurality of apertures have a common voltage.

11. The programmable phaseplate of claim 9, wherein the means connected to the at least one aperture comprises means connected to the at least one aperture for selectively obstructing passage of the charged particle beam through the at least one aperture.

12. The programmable phaseplate of claim 11, wherein the means for selectively obstructing the aperture is controllable to fully block the at least one aperture, partially block the at least one aperture, or leave the at least one aperture unblocked.

13. The programmable phaseplate of claim 11, wherein a degree of available obstruction is in a range of 0% to 100%.

14. A system for imaging a charged particle beam comprising a source of a beam of charged particles;
a lens; and
a programmable phaseplate arranged downstream of the lens to receive the beam, the programmable phaseplate comprising:
a plate member;
a plurality of apertures arranged in the plate member and in a path of the beam such that each aperture is configured to interact with a respective local portion of the beam; and
a plurality of aperture control member configured to separately control individual ones of the apertures or groups of the apertures, such that a control setting at a first one of the apertures is different from a control setting at a second one of the apertures, to control an interaction of the each aperture with the respective local portion of the beam and reduce aberration of the beam introduced by the lens.

15. A method of imaging a charged particle beam, the method comprising:
scanning fields-of-view around a plurality of different positions located away from an optical axis of a charged particle beam system; and
dynamically controlling voltages of apertures of a programmable phaseplate to control electron probe formation, wherein each aperture is configured to interact with a respective local portion of the charged particle beam and the dynamically controlling comprises:
reducing lens aberration of a wavefront of the charged particle beam by separately controlling individual ones of the apertures or groups of the apertures, such that a control setting at a first one of the apertures is different from a control setting at a second one of the apertures, to control an interaction of each aperture with the respective local portion of the charged particle beam.

16. The system of claim 14, wherein the plurality of apertures comprises a plurality of arcuate apertures in the plate member.

17. The system of claim 14, wherein the plurality of apertures comprises a plurality of ring segment apertures in the plate member.

18. The system of claim 17, wherein the ring segment apertures comprises ring segments that are formed by a plurality of segments separated by mechanical supports, and wherein the mechanical supports comprise electrical contacts for providing voltage to electrodes at the apertures.

19. The system of claim 14, wherein the plurality of apertures comprises a plurality of circle segment shaped apertures in the-plate member arranged in at least two concentric circles.

20. The system of claim 14, wherein a subset of the apertures of the plurality of apertures have a common voltage.

* * * * *